United States Patent
Takaya

(10) Patent No.: US 8,183,564 B2
(45) Date of Patent: May 22, 2012

(54) MULTICOLOR DISPLAY APPARATUS

(75) Inventor: Itaru Takaya, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 314 days.

(21) Appl. No.: 12/676,763

(22) PCT Filed: Nov. 19, 2008

(86) PCT No.: PCT/JP2008/071480
§ 371 (c)(1),
(2), (4) Date: Mar. 5, 2010

(87) PCT Pub. No.: WO2009/066791
PCT Pub. Date: May 28, 2009

(65) Prior Publication Data
US 2010/0237335 A1 Sep. 23, 2010

(30) Foreign Application Priority Data
Nov. 22, 2007 (JP) .................. 2007-302382

(51) Int. Cl.
*H01L 51/52* (2006.01)
*H01L 51/54* (2006.01)
(52) U.S. Cl. .................. 257/40; 257/89; 257/E51.022; 257/E51.027
(58) Field of Classification Search .................. 257/40, 257/89, E51.002, E51.027
See application file for complete search history.

(56) References Cited

U.S. PATENT DOCUMENTS

| | | |
|---|---|---|
| 6,505,901 B1 | 1/2003 | Fukuda |
| 2003/0044639 A1 | 3/2003 | Fukuda |
| 2006/0022587 A1* | 2/2006 | Jeong et al. .................. 313/504 |
| 2006/0033425 A1 | 2/2006 | Miura et al. |
| 2006/0046181 A1* | 3/2006 | Kim et al. .................. 430/199 |
| 2007/0228367 A1 | 10/2007 | Nakamura |

FOREIGN PATENT DOCUMENTS

| | | |
|---|---|---|
| EP | 1 788 647 A1 | 5/2007 |
| GB | 2 433 833 A | 7/2007 |
| JP | 2000-243573 A | 9/2000 |
| JP | 2000-323277 A | 11/2000 |
| JP | 2004-134101 A | 4/2004 |

* cited by examiner

*Primary Examiner* — David S Blum
(74) *Attorney, Agent, or Firm* — Fitzpatrick, Cella, Harper & Scinto

(57) ABSTRACT

In a multicolor display apparatus in which each of light emitting devices of three colors R, G and B has the same thickness from a reflection position of a reflection electrode to an organic emission layer, an organic emission layer of the R device and an organic emission layer of the B device each have electron transport property whereas an organic emission layer of the G device has hole transport property; and an optical distance (L) from the reflection position of the reflection electrode to an emission position of the organic emission layer in the light emitting devices of three colors satisfies $0.25 \times \lambda R < L < 0.75 \times \lambda B$, where $\lambda R$ and $\lambda B$ are peak wavelengths of emission spectra of the red light emitting device and the blue light emitting device.

2 Claims, 2 Drawing Sheets

MULTICOLOR DISPLAY APPARATUS

RELATED APPLICATIONS

This application is a 371 of PCT/JP2008/071480, filed Nov. 19, 2008 and claims priority to Japanese application JP 2007-302382, filed Nov. 22, 2007.

TECHNICAL FIELD

The present invention relates to a multicolor display apparatus which uses organic light emitting devices having three colors of red, green and blue, and each including at least a reflection electrode for reflecting light, a charge transport layer, an emission layer made of an organic compound and a light extraction electrode for transmitting light in the stated order.

BACKGROUND ART

FIG. 1 is a schematic view illustrating laminated structure of a top-emission organic light emitting device including a reflection electrode serving as an anode.

FIG. 1 illustrates a reflection electrode 1 for reflecting light, which is generated on a substrate, a hole transport layer 2, an emission layer 3 including a red light emission layer 3R, a green light emission layer 3G and a blue light emission layer 3B, an electron transport layer 4, an electron injection layer 5 and a light extraction electrode 6 for transmitting light.

It is known that the organic light emitting device described above has the maximal value of light emitting efficiency when an optical distance from an emission interface of the emission layer 3 of FIG. 1 to the reflection electrode 1 of FIG. 1 is set to odd multiples of ¼ emission wavelength λ (Japanese Patent Application Laid-Open No. 2000-243573).

In order to improve the light emitting efficiency by using the phenomenon described above, there is used a multicolor display apparatus including charge transport layers having different thicknesses for each color (Japanese Patent Application Laid-Open No. 2000-323277).

In addition, there is also known a multicolor display apparatus in which charge transport property of the emission layer is changed for each color without changing thicknesses of organic layers having different colors, and then chromaticity of red, green and blue is adjusted (Japanese Patent Application Laid-Open No. 2004-134101). More specifically, the charge transport property of the emission layer of a red light emitting device (R device) is made to be hole transport property, and the charge transport property of the emission layers of a green light emitting device (G device) and a blue light emitting device (B device) are each made to be electron transport property. In the R device having a long wavelength, the emission layer is used as a layer for causing an optical path difference. In the G device and the B device having a short wavelength, the emission layers are not used as layers for causing the optical path difference, thereby adjusting the chromaticity for each color.

In the multicolor display apparatus described in Japanese Patent Application Laid-Open No. 2000-323277, for the purpose of improving light extraction efficiency by an interference effect, the optical distance of the charge transport layer is attempted to be set based on the emission wavelength.

However, in order to set the optical distance of the charge transport layer based on the emission wavelength, it is necessary to separately apply colors on the charge transport layer with the use of a technique such as a mask vapor deposition, the charge transport layer being originally unnecessary to be separately applied with colors in only the consideration of charge transport. Therefore, there have been problems such as cost increase and an elongated time for manufacturing by using the mask vapor deposition for layers other than the emission layer.

Further, in the multicolor display apparatus described in Japanese Patent Application Laid-Open No. 2004-134101, the thickness of the charge transport layer is not changed for each color, but there is a room in which the three-color devices of R device, G device and B device can be brought close to more optimum constructive interference.

DISCLOSURE OF THE INVENTION

An object of the present invention is to provide a multicolor display apparatus in which layers originally unnecessary to be separately applied with colors, such as a charge transport layer, have the same thickness, and at the same time, three-color devices of a red (R) device, a green (G) device and a blue (B) device can be brought close to more optimum interference conditions.

There is provided a multicolor display apparatus, comprising:
a red light emitting device;
a green light emitting device; and
a blue light emitting device,
the red light emitting device, the green light emitting device, and the blue light emitting device each comprising:
a substrate;
a reflection electrode;
a hole transport layer;
an organic emission layer; and
a light transmission electrode,
the reflection electrode, the hole transport layer, the organic emission layer, and the light transmission electrode each being formed on the substrate in the stated order, wherein:
the organic emission layer of the red light emitting device and the organic emission layer of the blue light emitting device each have electron transport property, and the organic emission layer of the green light emitting device has hole transport property; and
the red light emitting device, the green light emitting device, and the blue light emitting device each have the same thickness from a reflection position of the reflection electrode to the organic emission layer, and have an optical distance (L) from the reflection position of the reflection electrode to the organic emission layer, the optical distance (L) satisfying $0.25 \times \lambda R < L < 0.75 \times \lambda B$,
where $\lambda R$ is a peak wavelength of an emission spectrum of the red light emitting device, and $\lambda B$ is a peak wavelength of an emission spectrum of the blue light emitting device.

According to the present invention, the layers originally unnecessary to be separately applied with colors, such as the charge transport layer, have the same thickness, and at the same time, the three-color devices of the red (R) device, the green (G) device, and the blue (B) device can be brought close to more optimum interference conditions.

Further features of the present invention will become apparent from the following description of exemplary embodiments with reference to the attached drawings.

BEST MODE FOR CARRYING OUT THE INVENTION

Figure 1:
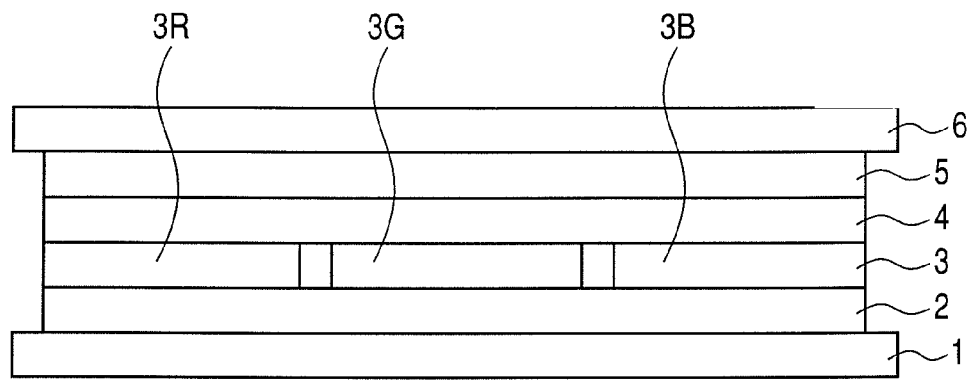
FIG. 1 is a schematic sectional view illustrating a multicolor display apparatus which uses an organic light emitting device of a general top-emission type, having a reflection electrode serving as an anode.

A description is made on a multicolor display apparatus according to an embodiment of the present invention.

The multicolor display apparatus at least includes organic light emitting devices of three colors, that is, a red light emitting device, a green light emitting device and a blue light emitting device. Each of the organic light emitting devices includes a reflection electrode for reflecting light, a hole transport layer, an emission layer (organic emission layer) made of an organic compound, and a light transmission electrode on a substrate formed in the stated order.

The emission layer of an R device and the emission layer of a B device each have the electron transport property, and the emission layer of a G device has hole transport property. Further, a thickness from a reflection position of the reflection electrode to the emission layer is equal between the red, green, and blue organic light emitting devices and with this structure, an optical distance L thereof is expressed by the following formula:

$$0.25 \times \lambda R < L < 0.75 \times \lambda B$$

where $\lambda R$ is a peak wavelength of an emission spectrum of the R device and $\lambda B$ is a peak wavelength of an emission spectrum of the B device, respectively.

As a result, there can be obtained a structure in which each of the R device and the B device has an emission position thereof on a side closer to the reflection electrode of the emission layer, and the G device has an emission position on a side closer to a transparent electrode of the emission layer.

In the organic light emitting device including the reflection electrode, when an optical distance between the emission position and the reflection position of the reflection electrode is set to about odd multiples of emission wavelength $\lambda \times 0.25$, a phase of light extracted after the reflection coincides with a phase of light directly extracted, with a result that light extraction efficiency becomes maximum.

Therefore, in the case of the multicolor display apparatus using the R device, the G device, and the B device, it is difficult to use the light extraction efficiency at a maximum as long as the thickness from the emission position to the reflection position of the reflection electrode is not changed for each color.

Further, a film thickness is made smaller or larger than the odd multiples of emission wavelength $\lambda \times 0.25$, which results in that a spectrum of the extracted light is shifted toward a short wavelength side or toward a long wavelength side.

In order to solve the above-mentioned problems, the thickness from the emission position to the reflection position of the reflection electrode can be adjusted for each color by a technique such as a mask vapor deposition.

However, in a case where the multicolor display apparatus using the R device, the G device and the B device is manufactured, the cost required for the mask vapor deposition occupies a large proportion of the whole cost. As a result, when the charge transport layer and the like other than the emission layer are formed by the mask vapor deposition, the cost is increased to a large degree.

In order to prevent the cost increase, the inventor of the present invention have studied that the multicolor display apparatus using the R device, the G device and the B device in a common layer is manufactured without performing the mask vapor deposition on the charge transport layer and a charge injection layer other than the emission layer.

As a result, the optical distance L from the emission position to the reflection electrode is set to be larger than $0.25 \lambda R$ which is maximal constructive interference of an emission wavelength $\lambda R$ of the R device. On the other hand, the optical distance L is set to be smaller than $0.75 \lambda B$ which is maximal constructive interference of an emission wavelength $\lambda B$ of the B device. Accordingly, it has been found that extraction spectra of the R device and the B device are made better in the range described above.

In other words, when the optical distance L is set to satisfy $0.25 \times \lambda R < L < 0.75 \times \lambda B$, the extraction spectrum of the R device is shifted toward the long wavelength and the extraction spectrum of the B device is shifted toward the short wavelength with respect to the emission spectrum, respectively.

However, when the optical distance L is used in the range described above, the optical distance L is approximate to minimal destructive interference of an emission wavelength $\lambda G$ of the G device, resulting in that the extraction efficiency of the green light becomes extremely small.

Generally, the emission layer of the G device is formed of a material having electron transport property. For example, the G device using a well-known aluminato-tris-8-hydroxyquinolate (Alq3) has an emission position thereof on an anode side of the emission layer. The inventor of the present invention found a phenomenon in which, when the emission layer of the G device was formed of a material having hole transport property, for example, of a material containing both a pyrene group and an aryl amine group, the emission position becomes a light extraction side of the emission layer.

Specifically, when the emission layer of the G device is formed of the material having hole transport property and the emission position is made on the light extraction side, even with the setting to $0.25 \times \lambda R < L < 0.75 \times \lambda B$, the G device can be adjusted to the maximal constructive interference of $0.75 \lambda G$ by adjusting a thickness of the emission layer thereof. Therefore, an optimum spectrum can be extracted.

Accordingly, in the multicolor display apparatus having the above-mentioned structure, the layers originally unnecessary to be separately applied with colors, such as the charge transport layer, have the same thickness, and at the same time, the three-color devices of the R device, the G device and the B device can be brought close to more optimum interference conditions. Accordingly, because the charge transport layer can be manufactured without using the mask vapor deposition, there can be provided the multicolor display apparatus with a wide color reproduction range, while suppressing costs and preventing an increase in a time required for manufacturing.

Hereinafter, the embodiment of the present invention is described in more detail.

Here, a description is made on only a top-emission light emitting device having a reflection electrode serving as an anode. However, a bottom-emission light emitting device and a device having a reflection electrode serving as a cathode are included in the present invention.

In a case of using a cathode on the reflection side, a thickness of the electron transport layer is set to a predetermined thickness, and the emission layers of the R device and the B device have the hole transport property, and the emission layer of the G device has the electron transport property.

Figure 2:
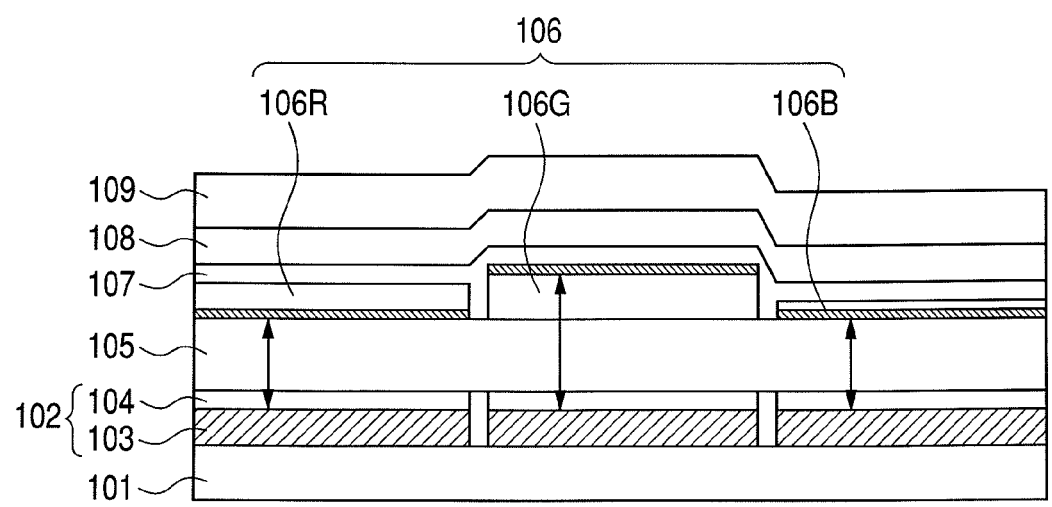
FIG. 2 is a schematic sectional view illustrating a multicolor display apparatus according to an embodiment and Example 1 of the present invention.

Hereinafter, a description is made with reference to FIG. 2. FIG. 2 is a schematic view illustrating a multicolor display apparatus which represents the present invention and uses a top-emission organic light emitting device having a reflection electrode serving as an anode. FIG. 2 illustrates a substrate 101, a reflection electrode (anode) 102, a metal layer 103, a transparent conductive layer 104, a hole transport layer 105, an emission layer 106 formed of an organic compound, an electron transport layer 107, an electron injection layer 108, and a light transmission electrode (cathode) 109. The emission layer 106 is referred to as a red light emission layer 106R, a green light emission layer 106G and a blue light emission layer 106B, which correspond to emission colors of red, green and blue.

In the present invention, an optical distance of the hole transport layer 105 which serves as a charge transport layer on a reflection electrode 102 side is set based on peak wavelengths of emission spectra of red and blue, and further an emission position in the emission layer 106 is controlled. Here, the peak wavelength of the emission spectrum in the present invention is defined not as an emission wavelength of an organic light emitting device but as a peak of an emission spectrum emitted from each of the emission layers of the R device, the G device, and the B device, and is obtained from an emission spectrum generated when a material of the emission layer is irradiated with an ultraviolet light. Besides, each of the optical distances of the respective layers is defined by the product of a film thickness and a refractive index. The refractive index may indicate different values depending on a measured wavelength, but in this case, the optical distances is defined by a refractive index of the emission wavelength emitted from the emission layers of the respective colors.

In the present invention, the anode 102 serving as the reflection electrode for reflecting light on the substrate 101 is provided. Here, light is reflected on a layer including the metal layer 103 with reflectance of 50% or more. Examples of a metal used for the metal layer 103 include Cr, Al, Ag, an alloy of those metals, and the like, and a metal having a higher reflectance can be used.

Further, in the present invention, there can be used, as the reflection electrode 102, layers obtained by laminating the transparent conductive layer 104 for enhancing the charge injection property on the metal layer as described above. As the transparent conductive layer 104, a transparent conductive material such as ITO or IZO is used. The transparent conductive material can be used as long as it has reflectance of 50% or more, and it is preferred to use a transparent conductive material having higher reflectance. The transparent conductive material is selected from materials which do not oxidize a metal disposed thereunder.

Further, in the present invention, the hole transport layer 105 formed of an organic compound is formed on the above-mentioned reflection electrode 102, and further the emission layer 106 similarly formed of the organic compound is formed. As the organic compound which forms the hole transport layer 105, a material which has been conventionally known can be used. In the present invention, the hole transport layer 105 is not formed by the mask vapor deposition for each emission color of red, green, or blue, but formed as a common layer across the light emitting devices having the different colors.

Then, the optical distance L from the reflection electrode 102 to the emission layer 106 is set to the range of $0.25 \times \lambda R < L < 0.75 \times \lambda B$. Accordingly, in the case where the reflection electrode 102 as illustrated in FIG. 1 is an anode, an optical distance LH of the hole transport layer 105 is set to a range of $0.25 \times \lambda R < LH < 0.75 \times \lambda B$.

In a case of using, as the reflection electrode 102, the above-mentioned layers in which the transparent conductive layer 104 is formed on the metal layer 103 or using a hole injection layer (not illustrated), an optical distance thereof is included in the optical distance L from the reflection electrode 102 to the emission layer 106. Therefore, it is necessary to set the optical distance LH by being subtracted from the optical distance L.

The reflection electrode 102 used in the present invention includes the metal layer, and a value of a phase shift φ becomes a value close to π. With regard to values out of π, it is necessary to convert an optical distance corresponding to the maximal constructive interference into a value represented by $0.25\lambda \times (2n - \phi/\pi)$ (n is a positive integer).

That is, more exactly, the optical distance is set to the following range:

$$0.25\lambda R \times (2 - \phi/\pi) < L < 0.25\lambda B \times (4 - \phi/\pi)$$

where φ indicates a phase shift in the reflection electrode.

Further, in the emission layer 106 of the present invention, red, green and blue are individually formed. For the formation of the emission layer 106, the mask vapor deposition can be used.

As long as the red light emission layer 106R and the blue light emission layer 106B have the emission positions on sides closer to the reflection electrode 102, conventional materials can be used therefor. The materials with an optimal thickness with respect to efficiency and degradation lifetime can be used. In the case where the reflection electrode 102 as illustrated in FIG. 1 is the anode, the red light emission layer 106R and the blue light emission layer 106B, which have the emission positions on sides closer to the anode, are emission layers having electron transport property, and are defined by the fact that mobility for electron transport is faster than mobility for hole transport.

Further, there is used the green light emission layer 106G of the present invention having the emission position on a side closer to the light transmission electrode 109. In the case where the light transmission electrode 109 as illustrated in FIG. 1 is a cathode, the green light emission layer 106G which has the emission position on a side closer to the cathode is an emission layer having hole transport property, and is defined by the fact that the mobility for hole transport is faster than the mobility for electron transport. As a material of the green light emission layer 106G, a conventional material can be used as long as the material has the emission position on a side closer to the light transmission electrode 109. However, it is preferred to use a structure in which the light transmission electrode 109 becomes the cathode, and the emission layer having the hole transport property is required. As the green light emission layer 106G described above, a layer in which a light emitting dopant material which emits green light is dispersed in a host material having the hole transport property can be used. As the light emitting dopant material, a conventional material can be used. As the host material having the hole transport property, there can be used a host material containing both a substituted or unsubstituted pyrene group and a substituted or unsubstituted aryl amine group having the hole transport property. Specific examples of the host material described above can include the following material because of high emission quantum efficiency and long degradation lifetime.

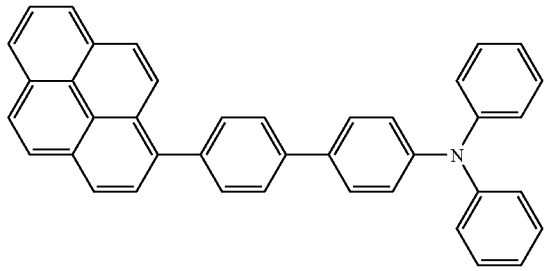

Further, the thickness of the green light emission layer 106G is set so that an optical distance LG enhances a peak wavelength λG of the emission spectrum. It is more preferred to set the sum of the optical distance LG and the optical distance L from the reflection electrode 102 to the emission position (light extraction electrode side) of the green light emission layer 106G to maximal constructive interference close to 0.75 λG.

In addition, the electron transport layer 107 and the electron injection layer 108 may be formed on the emission layer 106, and a conventional material can be used also in this case.

Further thereon, the light transmission electrode 109 for transmitting light is laminated. As a material which forms the light transmission electrode 109, a transparent conductive material such as ITO or IZO may be used, or a semitransparent metal thin film may be used. As the semitransparent metal thin film, the same metal as that of the reflection electrode may be used, and any metal may be used irrespective of a proportion of transmission and reflection, as long as the metal has a thickness with absorption equal to or smaller than 50%.

As described above, it is generally known that, in the top-emission light emitting device, an interference effect is also caused by the optical distance of the light extraction electrode side. In the present invention, when there is a void above the light extraction electrode, a refractive index difference is caused on an interface thereof, and then an optical distance from the reflection electrode or from the reflection layer is optimized, whereby the light extraction efficiency can be increased. Besides, when a semitransparent metal electrode is used for the light extraction electrode, the reflection on the interface between the organic layer and the metal electrode is generated, and then an optical distance from the reflection electrode or from the reflection layer is optimized, whereby the light extraction efficiency can be increased.

Hereinafter, examples of the present invention are described. Materials and device structures used in the examples can be particularly used, but the present invention is not limited thereto.

Example 1

Example 1 indicates a manufacturing procedure of a multicolor display apparatus using the organic light emitting device having the top-emission structure in which the reflection electrode formed by laminating Ag and IZO is used, and measured device characteristics thereof. FIG. 2 illustrates a schematic sectional view of the multicolor display apparatus of this example, and Table 1 shows a film thickness structure.

TABLE 1

|  |  | R | G | B |
|---|---|---|---|---|
| Light transmission electrode |  |  | 60 nm |  |
| Electron injection layer |  |  | 40 nm |  |
| Electron transport layer |  |  | 10 nm |  |
| Emission layer |  | 50 nm | 60 nm | 20 nm |
| Hole transport layer |  |  | 140 nm |  |
| Reflection electrode | IZO | 20 nm | 20 nm | 20 nm |
|  | Ag | 200 nm | 200 nm | 200 nm |

A substrate 101 having an electrode for multi-color display capable of performing 200-ppi display, on which TFTs, circuits, laminated electrodes (reflection electrodes) 102 including Ag 103 (thickness of 200 nm)/IZO 104 (thickness of 20 nm), a planarization film (not illustrated) and a device isolation film (not illustrated) were formed on glass, was formed. The substrate 101 was subjected to UV/ozone cleaning.

Subsequently, the cleaned substrate 101 and materials were set in a vacuum vapor deposition apparatus (manufactured by ULVAC, Inc.) and the vacuum vapor deposition apparatus was evacuated to $1 \times 10^{-6}$ Torr. After that, a film of N,N'-α-dinaphthyl-benzidine (α-NPD) was formed with a thickness of 140 nm on the reflection electrode 102, thereby forming the hole transport layer 105.

Next, a co-deposited film of Ir complex (18 vol %) and 4,4'-N,N'-dicarbazole-biphenyl (CBP) in which red light emission is known was formed in an electrode position for red with a thickness of 50 nm by using a mask vapor deposition method, thereby forming the red light emission layer 106R.

Next, in the same manner, a co-deposited film of coumarin dye (2.0 vol %) and a host material containing a pyrene group and an aryl amine group and expressed by the following structural formula in which green light emission is known was formed in an electrode position for green with a thickness of 60 nm by using the mask vapor deposition method, thereby forming the green light emission layer 106G.

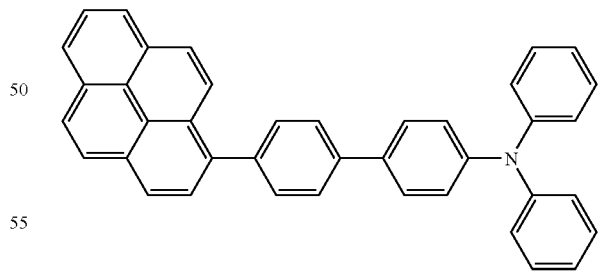

Next, in the same manner, a co-deposited film of perylene dye (1.0 vol %) and tris[8-hydroxyquinolinate]aluminum (Alq3) in which blue light emission is known was formed with a thickness of 20 nm by using the mask vapor deposition method, thereby forming the blue light emission layer 106B.

Then, a film of phenanthroline compound expressed by the following structural formula was formed with a thickness of 10 nm as the electron transport layer 107.

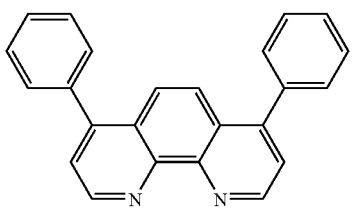

Next, a co-deposited film of cesium carbonate (3.0 vol %) and phenanthroline compound expressed by the above structural formula was formed with a thickness of 40 nm on the electron transport layer 107 to form the electron injection layer 108.

Subsequently, the substrate obtained after the electron injection layer 108 was formed was transferred to another sputtering apparatus (manufactured by Osaka Vacuum, Ltd.) and an indium tin oxide (ITO) film was formed on the electron injection layer 108 with a thickness of 60 nm by a sputtering method to obtain the light transmission electrode 109.

After that, the substrate was transferred to a glove box and sealed with a glass cap containing a drying agent under a nitrogen atmosphere.

Separately from the above, the emission layer 106 for red, green and blue was formed as a single layer film on quartz glass, and an emission spectrum was examined by using ultraviolet light irradiation.

A peak λR of the emission wavelength was 610 nm, a refractive index of IZO used for the reflection electrode 102 at this wavelength was 2.04, and a refractive index of α-NPD used for the hole transport layer 105 at this wavelength was 1.79.

It is satisfied that 0.25×λR=152.5, and the optical distance L from the reflection electrode 102 to the emission position of the red light emission layer 106R becomes 291.4 which is the sum of the IZO (20 nm×2.04=40.8) and the hole transport layer (140 nm×1.79=250.6). Accordingly, it is satisfied that 0.25×λR<L.

Further, a peak λB of the emission wavelength was 470 nm, a refractive index of IZO used for the reflection electrode 102 at this wavelength was 2.16, and a refractive index of α-NPD used for the hole transport layer 105 at this wavelength was 1.86.

It is satisfied that 0.75×λB=372.5, and the optical distance L from the reflection electrode 102 to the emission position of the blue light emission layer 106B becomes 303.6 which is the sum of the IZO (20 nm×2.16=43.2) and the hole transport layer (140 nm×1.86=260.4). Accordingly, it is satisfied that L<0.75×λB.

Further, a peak λG of the emission wavelength was 530 nm, a refractive index of IZO used for the reflection electrode 102 at this wavelength was 2.10, a refractive index of α-NPD was 1.81, and a refractive index of the green light emission layer 106G was 1.77.

It is found that the constructive interference of the green light wavelength 0.75×λG is caused when an optical distance from the emission position of the green light emission layer 106G to the reflection electrode 102 satisfies 0.75×530 nm=397.5).

At the same time, this optical distance from the emission position of the green light emission layer 106G to the reflection electrode 102 becomes 401.6 which is the sum of the IZO (20 nm×2.10=42), the hole transport layer (140 nm×1.81=253.4) and the green light emission layer (60 nm×1.77=106.2).

This enhances the peak wavelength of the green spectrum even when it is taken into consideration that the emission position of the green light emission layer 106G is slightly shifted inside the emission layer.

Further, when charge mobility of the emission layer was also examined by a TOF method, it was found that the electron mobility was faster than the hole mobility by one or more orders of magnitude in the red and blue light emission layers, which were emitting light on sides brought into contact with the hole transport layer, that is, on sides close to the reflection electrode of the emission layer.

In addition, it was found that the hole mobility was faster than the electron mobility by one or more orders of magnitude in the green light emission layer 106G, which was emitting light on a side brought into contact with the electron transport layer 107, that is, on a side close to the light transmission electrode of the emission layer.

The emitted lights of the multicolor display apparatus obtained by the above-mentioned procedure were examined, which revealed that the initial light emitting efficiency and chromaticity coordinates (x, y) for red were 16.7 cd/A(0.65, 0.35), the initial light emitting efficiency and chromaticity coordinates (x, y) for green were 11.5 cd/A(0.27, 0.69), and the initial light emitting efficiency and chromaticity coordinates (x, y) for blue were 1.6 cd/A(0.14, 0.06), respectively.

Though the mask vapor deposition was not performed on the layers other than the emission layer, the multicolor display apparatus with a wide color reproduction range, in which efficiency and chromaticity of red, green and blue were satisfactory, was obtained.

Example 2

Figure 3:
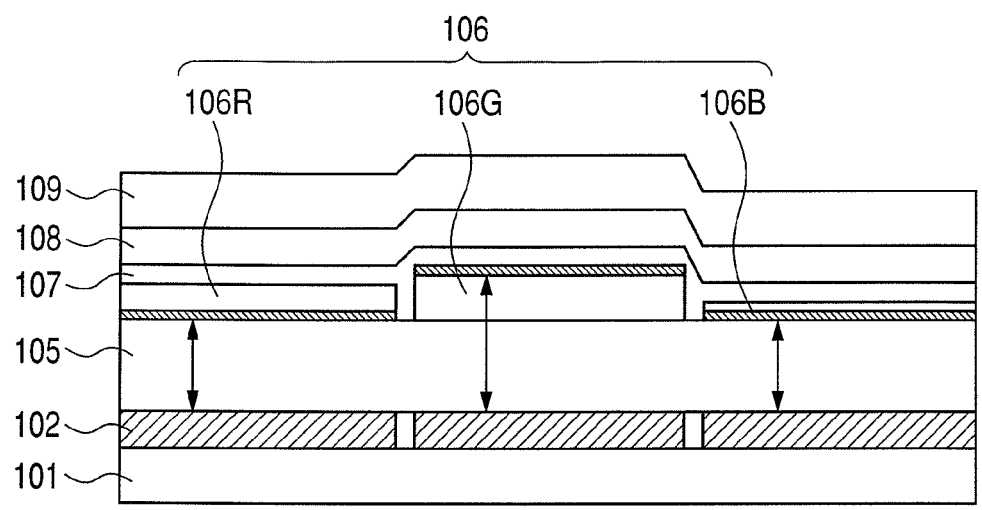
FIG. 3 is a schematic sectional view illustrating a multicolor display apparatus according to Example 2 of the present invention.

Example 2 indicates a manufacturing procedure of a multicolor display apparatus using the organic light emitting device having the top-emission structure in which the reflection electrode is made of Cr, and measured device characteristics thereof. FIG. 3 illustrates a schematic sectional view of the multicolor display apparatus of this example, and Table 2 shows a film thickness structure. In FIG. 3, the same reference symbols as those of FIG. 2 represent the same constituents as those of FIG. 2.

TABLE 2

|  |  | R | G | B |
|---|---|---|---|---|
| Light transmission electrode |  |  | 60 nm |  |
| Electron injection layer |  |  | 40 nm |  |
| Electron transport layer |  |  | 10 nm |  |
| Emission layer |  | 50 nm | 60 nm | 20 nm |
| Hole transport layer |  |  | 162 nm |  |
| Reflection electrode | Cr | 200 nm | 200 nm | 200 nm |

The substrate 101 having an electrode for multi-color display capable of performing 200-ppi display, on which TFTs, circuits, the reflection electrode 102 made of Cr (thickness of 200 nm), a planarization film (not illustrated), and a device isolation film (not illustrated) were formed on glass, was subjected to UV/ozone cleaning.

The multicolor display apparatus was manufactured in the same manner as Example 1 except that a film of N,N'-α-dinaphthyl-benzidine (α-NPD) was formed with a thickness of 162 nm as the hole transport layer 105. In this case, the optical distances from the emission positions of the light emitting devices of the respective colors to the reflection electrode 102 were substantially the same as those of Example 1.

The emitted lights of the multicolor display apparatus obtained by the above-mentioned procedure were examined, which revealed that the initial light emitting efficiency and chromaticity coordinates (x, y) for red were 13.5 cd/A(0.66, 0.35), the initial light emitting efficiency and chromaticity coordinates (x, y) for green were 9.9 cd/A(0.28, 0.69), and the initial light emitting efficiency and chromaticity coordinates (x, y) for blue were 1.6 cd/A(0.14, 0.07), respectively.

Though the mask vapor deposition was not performed on the layers other than the emission layer, the multicolor display apparatus with a wide color reproduction range, in which efficiency and chromaticity of red, green and blue were satisfactory, was obtained.

Comparative Example 1

Figure 4:
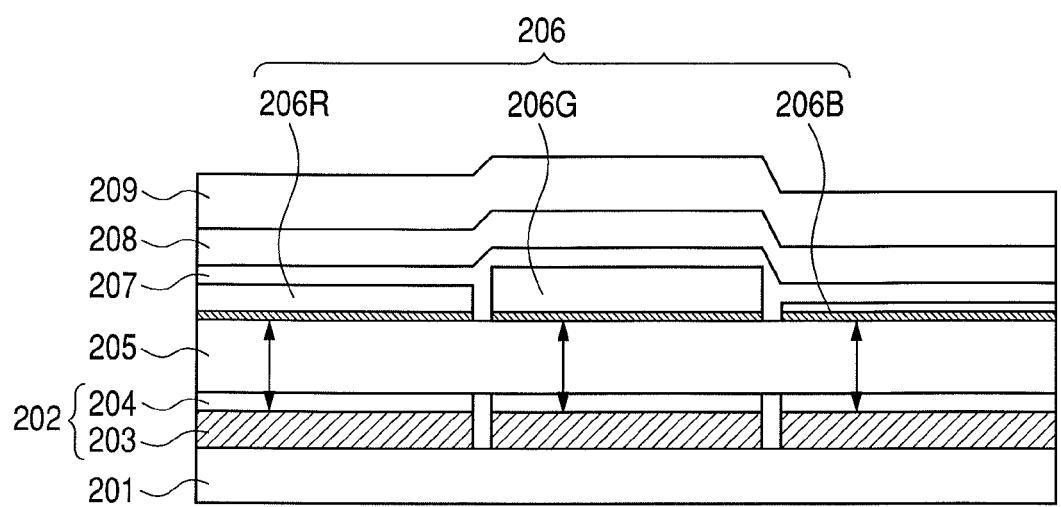
FIG. 4 is a schematic sectional view illustrating a multicolor display apparatus according to Comparative Example 1 of the present invention.

Comparative Example 1 indicates a manufacturing procedure of a multicolor display apparatus using the organic light emitting device having the top-emission structure in which the reflection electrode formed by laminating Ag and IZO is used, and measured device characteristics thereof. FIG. 4 illustrates a schematic sectional view of the multicolor display apparatus of this comparative example. In FIG. 4, reference symbols 201 to 209 denote constituents corresponding to reference symbols 101 to 109 of FIG. 2.

The multicolor display apparatus was manufactured in the same manner as Example 1 except that a co-deposited film of the aluminato-tris-8-hydroxyquinolate (Alq3) and the coumarin dye (2.0 vol %) used in Example 1 was formed with a thickness of 60 nm for the green light emission layer 206G to form the green light emission layer 206G.

The emitted lights of the multicolor display apparatus obtained by the above-mentioned procedure were examined, which revealed that the initial light emitting efficiency and chromaticity coordinates (x, y) for red and the initial light emitting efficiency and chromaticity coordinates (x, y) for blue were the same as those in Example 1, and the initial light emitting efficiency and chromaticity coordinates (x, y) for green was 6.7 cd/A(0.19, 0.72).

The light emitting efficiency for green is lowered compared with Example 1, and is further shifted toward the short wavelength. Therefore, it is conceived that the emission position is shifted to a side close to the reflection electrode 102 of the green light emission layer 206G.

In this case, the optical distance from the emission position of the green light emission layer 206G to the reflection electrode 102 becomes 295.4 which is the sum of the IZO (20 nm×2.10=42) and the hole transport layer (140 nm×1.81=253.4), and the sum is largely shifted from 397.5 nm which is the constructive interference of $0.75 \times \lambda G$.

In the present invention, the thickness from the reflection electrode 102 to the emission layer 106 was common between the organic light emitting devices of red, green, and blue, and the optical distance L thereof was set to $0.25 \times \lambda R < L < 0.75 \times \lambda B$.

Further, there was obtained the structure in which the R device and the B device had the emission positions on the sides close to the reflection electrode 102 of the emission layer 106, and the G device had the emission position on the side close to the light transmission electrode 109 of the emission layer 106.

With this structure, it was designated that, though the mask vapor deposition was not performed on the layers other than the emission layer, the multicolor display apparatus with a wide color reproduction range, in which efficiency and chromaticity of red, green and blue were satisfactory, could be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-302382, filed Nov. 22, 2007, which is hereby incorporated by reference herein in its entirety.

The invention claimed is:

1. A multicolor display apparatus, comprising:
   a red light emitting device;
   a green light emitting device; and
   a blue light emitting device,
   the red light emitting device, the green light emitting device, and the blue light emitting device each comprising:
   a substrate;
   a reflection electrode;
   a hole transport layer;
   an organic emission layer; and
   a light transmission electrode,
   the reflection electrode, the hole transport layer, the organic emission layer, and the light transmission electrode each being formed on the substrate in the stated order, wherein:
   the organic emission layer of the red light emitting device and the organic emission layer of the blue light emitting device each have electron transport property, and the organic emission layer of the green light emitting device has hole transport property; and
   the red light emitting device, the green light emitting device, and the blue light emitting device each have the same thickness from a reflection position of the reflection electrode to the organic emission layer, and have an optical distance (L) from the reflection position of the reflection electrode to the organic emission layer, the optical distance (L) satisfying $0.25 \times \lambda R < L < 0.75 \times \lambda B$,
   where $\lambda R$ is a peak wavelength of an emission spectrum of the red light emitting device, and $\lambda B$ is a peak wavelength of an emission spectrum of the blue light emitting device.

2. The multicolor display apparatus according to claim 1, wherein:
   the organic emission layer of the green light emitting device is formed of a light emitting dopant material and a host material; and
   the host material contains both one of a substituted and unsubstituted pyrene group and one of a substituted and unsubstituted aryl amine group each having the hole transport property.

* * * * *